United States Patent
Kim et al.

(10) Patent No.: US 9,054,327 B2
(45) Date of Patent: Jun. 9, 2015

(54) ORGANIC LIGHT EMITTING DISPLAY DEVICE

(71) Applicant: LG Display Co., Ltd., Seoul (KR)

(72) Inventors: Jong Sung Kim, Gyeonggi-do (KR); Ho Jin Kim, Gyeonggi-do (KR)

(73) Assignee: LG Display Co., Ltd., Seoul (KR)

(*) Notice: Subject to any disclaimer, the term of this patent is extended or adjusted under 35 U.S.C. 154(b) by 174 days.

(21) Appl. No.: 13/681,645

(22) Filed: Nov. 20, 2012

(65) Prior Publication Data
US 2013/0126837 A1    May 23, 2013

(30) Foreign Application Priority Data
Nov. 21, 2011  (KR) .......................... 10-2011-0121860

(51) Int. Cl.
*H01L 51/50* (2006.01)
*H01L 51/00* (2006.01)
*H01L 51/52* (2006.01)

(52) U.S. Cl.
CPC ............ *H01L 51/50* (2013.01); *H01L 51/0032* (2013.01); *H01L 51/5259* (2013.01); *H01L 51/5256* (2013.01)

(58) Field of Classification Search
CPC . H01L 51/5237; H01L 23/26; H01L 51/5259; H01L 2251/5361; H01L 51/5271
USPC ................. 257/40, 682, E21.5, E23.13, 88
See application file for complete search history.

(56) References Cited

U.S. PATENT DOCUMENTS

| | | | |
|---|---|---|---|
| 8,963,423 B2 | 2/2015 | Han et al. | |
| 2003/0038590 A1 | 2/2003 | Silvernail et al. | |
| 2007/0013292 A1 | 1/2007 | Inoue et al. | |
| 2009/0289549 A1 | 11/2009 | Lee et al. | |
| 2010/0118515 A1 | 5/2010 | Tanaka et al. | |
| 2011/0212304 A1 | 9/2011 | Han et al. | |
| 2014/0093700 A1 | 4/2014 | Han et al. | |
| 2014/0138668 A1* | 5/2014 | You et al. .......................... 257/40 |

FOREIGN PATENT DOCUMENTS

| | | |
|---|---|---|
| CN | 102179971 A | 9/2011 |
| KR | 10-2005-0104520 A | 11/2005 |
| KR | 10-2009-0065920 A | 6/2009 |
| TW | 200417281 A | 9/2004 |

OTHER PUBLICATIONS

Office Action issued in counterpart Korean Patent Application No. 10-2011-0121860 dated Mar. 18, 2014.
Office Action dated Feb. 17, 2015, issued by the Taiwanese Intellectual Property Office in Taiwan Patent Application No. 101143550.
Office Action dated Jan. 20, 2015, issued by the State Intellectual Property Office of China in Chinese Patent Application No. 201210473328.6.

* cited by examiner

*Primary Examiner* — Cathy N Lam
(74) *Attorney, Agent, or Firm* — Morgan, Lewis & Bockius LLP

(57) ABSTRACT

An organic light emitting display device is disclosed which includes: a substrate defined into a display area and a non-display area; a light emission diode layer formed on the substrate and configured to emit light; a TFE layer formed on the light emission diode layer and configured to protect the light emission diode layer; an intrusive moisture guide layer configured to prevent moisture intrusion into the light emission diode layer; and a getter configured to absorb moisture which is guided by the intrusive moisture guide layer.

17 Claims, 2 Drawing Sheets

ORGANIC LIGHT EMITTING DISPLAY DEVICE

The present application claims priority under 35 U.S.C. §119(a) of Korean Patent Application No. 10-2011-0121860 filed on Nov. 21, 2011, which is hereby incorporated by reference in its entirety.

BACKGROUND

1. Field of the Disclosure

The present application relates to an organic light emitting display device.

2. Description of the Related Art

Devices for displaying information are being widely developed. The display devices include liquid crystal display (LCD) devices, organic light-emitting display (OLED) devices, electrophoresis display devices, field emission display (FED) devices, and plasma display devices.

Among these display devices, OLED devices have the features of lower power consumption, wider viewing angle, lighter weight and higher brightness compared to LCD devices. As such, the OLED device is considered to be next generation display devices.

The OLED device includes a light emission layer of a light emission element from an organic material or a highly polymerized compound. The light emission layer can gradually deteriorate by reacting with peripheral oxygen, moisture, or other environmental factors. As such, the life span of the light emission element can be reduced. Particularly, electrodes, such as a cathode and an anode, of the light emission element can be easily oxidized when they are exposed to oxygen or moisture. Due to this, the characteristics of the light emission element can vary considerably.

In attempts to overcome the above-mentioned disadvantages and secure stability of the OLED device, a variety of technology research and development are being executed. In order to prevent the intrusion of oxygen and moisture and restrict deterioration, an OLED device encapsulated with a metal cap to which an absorption agent is attached is being used in the display device field up to the present under consideration of the manufacturing process.

The encapsulation using the metal cap makes it difficult for the OLED device to be lighter weight and thinner. Particularly, the metal cap is impossible to apply to a next generation flexible light-emitting display device.

In view of this point, alternative methods capable of substituting the encapsulation which uses the metal cap are recently being developed.

BRIEF SUMMARY

Accordingly, embodiments of the present application are directed to an OLED device that substantially obviates one or more of problems due to the limitations and disadvantages of the related art.

The embodiments are to provide an OLED device that is adapted to enhance picture quality.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to a first general aspect of the present embodiment, an OLED device includes: a substrate defined into a display area and a non-display area; a light emission diode layer formed on the substrate and configured to emit light; a TFE layer formed on the light emission diode layer and configured to protect the light emission diode layer; an intrusive moisture guide layer configured to prevent moisture intrusion into the light emission diode layer; and a getter configured to absorb moisture which is guided by the intrusive moisture guide layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE EMBODIMENTS

Figure 1:
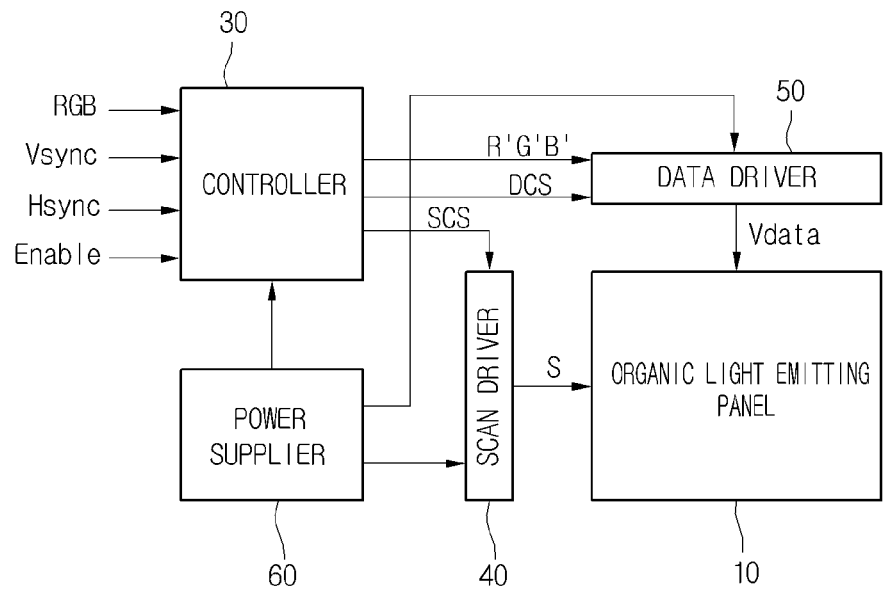
FIG. 1 is a block diagram showing an organic light emitting display device according to an embodiment of the present disclosure.

In the present disclosure, it will be understood that when an element, such as a substrate, a layer, a region, a film, or an electrode, is referred to as being formed "on" or "under" another element in the embodiments, it may be directly on or under the other element, or intervening elements (indirectly) may be present. The term "on" or "under" of an element will be determined based on the drawings.

Reference will now be made in detail to the present embodiments, examples of which are illustrated in the accompanying drawings. In the drawings, the sizes and thicknesses of elements can be exaggerated, omitted or simplified for clarity and convenience of explanation, but they do not mean the practical sizes of elements.

FIG. 1 is a block diagram showing an organic light emitting display device according to an embodiment of the present disclosure.

Referring to FIG. 1, the organic light emitting display device according to an embodiment of the present disclosure can include an organic light emitting panel 10, a controller 30, a scan driver 40, a data driver 50 and a power supplier 60.

The scan driver 40 can apply scan signals S to the organic light emitting panel 10.

The data driver 50 can apply data voltages Vdata to the organic light emitting panel 10.

The power supplier 60 can apply a plurality of drive voltages to the controller 30, the scan driver 40 and the data driver 50.

Although it is not shown in the drawing, the organic light emitting panel 10 can include a plurality of scan lines, a plurality of data lines and a plurality of power lines. The scan lines and the data lines crossing each other can define a plurality of pixel regions. Each pixel region can electrically connected to one of the scan lines, one of the data lines and one of the power lines.

For example, each scan line can be electrically connected with the plurality of pixel regions arranged in a horizontal direction. Each data line can be electrically connected with the plurality of pixel regions arranged in a vertical direction.

As such, the scan signal S, the data voltage Vdata and a supply voltage can be applied to each of the pixel regions. In detail, the scan signal S can be applied to the pixel region through one of the scan lines. The data voltage Vdata can be applied to the pixel region through one of the data lines. The supply voltage can be applied to the pixel region through one of the power lines.

Figure 2:
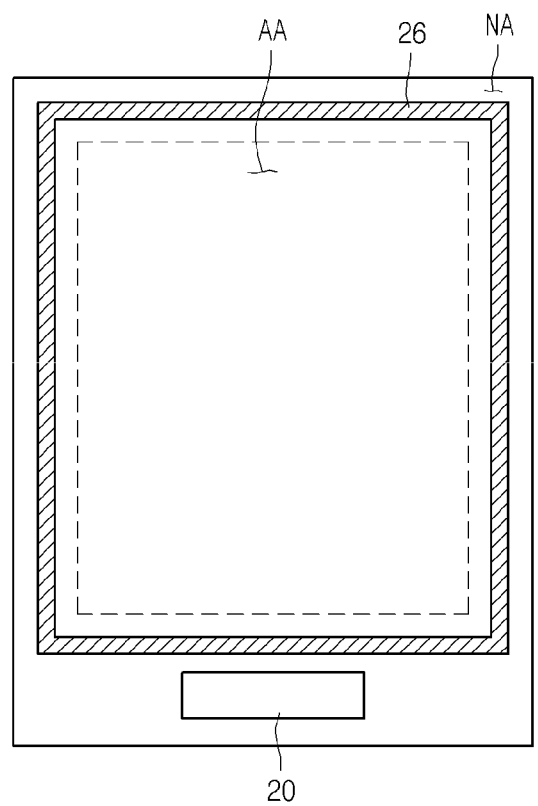
FIG. 2 is a planar view showing an OLED device according to a first embodiment of the present disclosure.

FIG. 2 is a planar view showing an OLED device according to a first embodiment of the disclosure.

Referring to FIG. 2, the OLED device according to a first embodiment of the present disclosure can include a substrate 1 defined a display area AA, which is used to display an image, and a non-display area NA in which any image is not displayed.

The display area AA can be formed in the central area of the OLED device. The non-display area NA can be positioned in the peripheral area around the display area AA.

The OLED device can further include a driver chip 20 and a getter 26 which are formed in the non-display area NA.

The driver chip 20 can include at least one of the scan driver, the data driver and the controller. Also, the driver chip 20 can apply drive signals to pixel regions (not shown) within the display area through a plurality of lines.

The getter 26 can be formed in such a manner as to surround edges of the display area AA. In other words, the getter 26 can be formed in such a manner as to separate the display area AA and the non-display area NA from each other by a fixed distance. Consequently, the getter 26 can be formed in the boundary between the display area AA and the non-display area NA.

Figure 3:
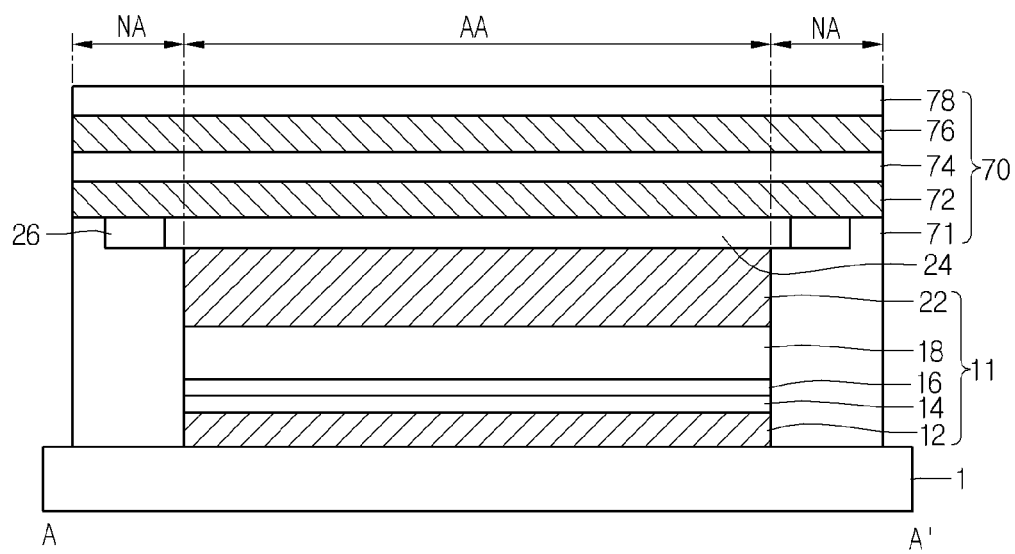
FIG. 3 is a cross-sectional view showing the OLED device taken along a line A-A' in FIG. 2.

FIG. 3 is a cross-sectional view showing the OLED device taken along a line A-A' in FIG. 2.

Referring to FIG. 3, the OLED device according to a first embodiment of the present disclosure includes a light emission diode layer 11, an intrusive moisture guide layer 24 and a TFE layer 70 which are sequentially stacked on a substrate 1.

The light emission diode layer 11 can be formed to include a transparent electrode 12, a hole transport layer 14, a light emission layer 16, an electron transport layer 18 and a metal electrode 22 which are sequentially stacked on the substrate 1. However, the light emission diode layer 11 is not limited to the above-mentioned structure.

The intrusive moisture guide layer can be formed on the light emission diode layer 11. A getter 26 can be formed on the side surfaces of the intrusive moisture guide layer 24. In detail, the getter 26 can be formed in the non-display area NA around the intrusive moisture guide layer 24. In other words, the getter 26 can be formed in such a manner as to come into contact with the intrusive moisture guide layer 24.

The intrusive moisture guide layer 24 can be formed from a transparent material and in a plate shape. The intrusive moisture guide layer formed in the plate shape guides intrusive moisture to flow laterally. The getter 26 absorbs the intrusive moisture flowing laterally along the intrusive guide layer 24. In accordance therewith, the moisture intrusion into the light emission diode layer 11 can be prevented.

The getter 26 can be from a material removing oxygen and moisture. For example, the getter 26 can be formed from one material selected from a material group which includes barium oxide, calcium oxide, magnesium oxide, lithium oxide, sodium oxide, potassium oxide, lithium sulfate, sodium sulfate, calcium sulfate, magnesium sulfate, potassium sulfate, calcium chlorate, magnesium chloride, calcium bromide, cesium bromide, vanadium bromide and calcium nitride.

In this manner, moisture passing through the TFE layer 70 can be dispersed laterally along the intrusive moisture guide layer within the display area AA and absorbed by the getter within the non-display area NA. As such, the moisture intrusion into the light emission diode layer 11 within the display area AA can be prevented. In accordance therewith, a stained image and a pixel defect can be prevented. As a result, picture quality can be enhanced.

The TFE layer 70 can be formed in a stacked layer structure of organic and inorganic films. For example, the TFE layer 70 can include a first organic film 71, a first inorganic film 72, a second organic film 74, a second inorganic film 76 and a third organic film 78 which are sequentially stacked.

The first through third organic films 71, 74 and 78 can be formed from at least one material selected from a material group which includes an olefin based polyethylene, polypropylene, an amide based material, polystyrene, polyethylene terephthalate, polybutyl terephthalate, polyvinylidene chloride, polycarbonate, cellulose acetate, and poly(math)acrylate. The olefin based polyethylene can include low density polyethylene, very low density polyethylene (VLDPE) and high density polyethylene. The amide based material can include nylon6, nylon 66, nylon 6/9, nylon 6/10, nylon 6/12, nylon 11 and nylon 12. In other words, each of the first through third organic films 71, 74 and 78 can be formed to include at least one material selected from the above-mentioned material group under consideration of thermal and mechanical characteristics.

The first and second inorganic films 72 and 76 can be formed from an alloy which includes at least one of aluminum Al, tin Sn, and zinc Zn.

Although it is not shown in the drawings, the TFE layer can further include adhesive layers used to adhere the organic and inorganic films to each other. Each of the adhesive layers can be formed from one of an epoxy based resin and an acrylate based resin.

The organic films 71, 74 and 78 are used to protect the light emission diode layer 11 from external impacts. The inorganic films 72 and 76 have the function of protecting the light emission diode layer 11 from external oxygen and moisture.

Although the intrusion of oxygen and moisture is prevented by the inorganic films 72 and 76, moisture can flow toward the light emission diode layer along gaps in the inorganic films 72 and 76.

However, moisture intruded through the gaps of the inorganic films 72 and 76 is dispersed laterally along the intrusive moisture guide layer 24 and then absorbed by the getter 26. As such, the moisture intrusion into the light emission diode layer 11 can be prevented. In accordance therewith, picture quality can be enhanced.

The intrusive moisture guide layer 24 can be formed from a material with a refractive index between those of the light emission diode layer 11 and the TFE layer 70. The intrusive moisture guide layer 24 having the refractive index between those of the light emission diode layer 11 and the TFE layer 70 can prevent light loss.

Figure 4:
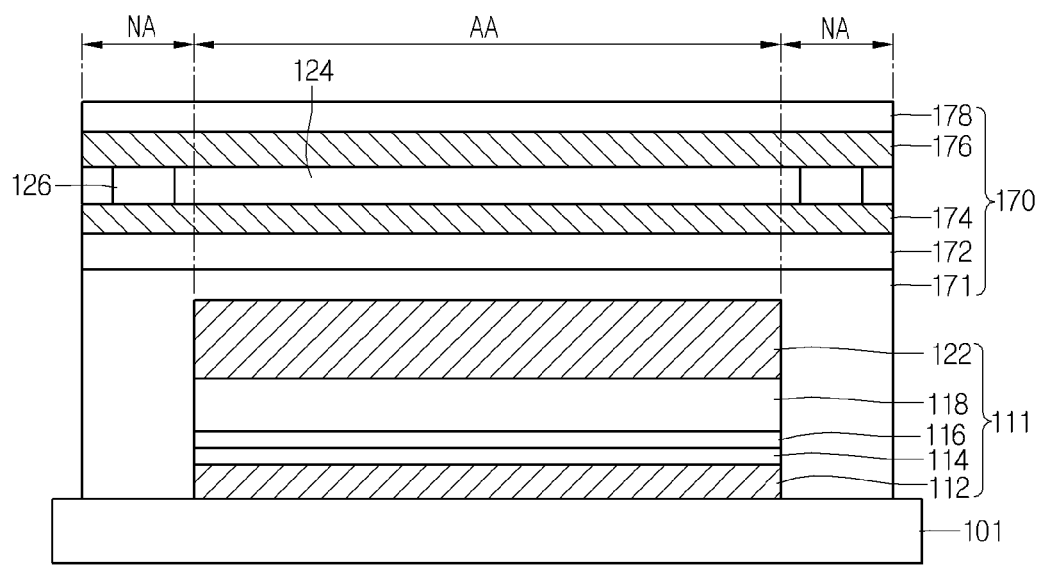
FIG. 4 is a cross-sectional view showing an organic light emitting display device according to a second embodiment of the present disclosure.

FIG. 4 is a cross-sectional view showing an OLED device according to a second embodiment of the present disclosure.

The OLED device of the second embodiment has the same configuration as that of the first embodiment except that the intrusive moisture guide layer and the getter are positioned within the TFE layer. As such, the description of the first embodiment to be repeated in the second embodiment of the present disclosure will be omitted.

Referring to FIG. 4, the OLED device according to a second embodiment of the present disclosure includes a light emission diode layer 111 formed on a substrate 101, and a TFE layer 170 formed on the light emission diode layer 111.

The light emission diode layer 111 can be formed to include a transparent electrode 112, a hole transport layer 114, a light emission layer 116, an electron transport layer 118 and a metal electrode 122 which are sequentially stacked on the substrate 101. However, the light emission diode layer 111 is not limited to the above-mentioned structure.

The TFE layer 170 can be formed in a stacked layer structure of organic and inorganic films. For example, the TFE layer 170 can include a first organic film 171, a first inorganic film 172, a second organic film 174, a second inorganic film 176 and a third organic film 178 which are sequentially stacked.

The OLED device can further include an intrusive moisture guide layer 124 and a getter 126 which are formed between the second organic film 174 and the second inorganic film 176.

The getter 126 can be formed along the side surfaces of the intrusive moisture guide layer 124. In detail, the getter 126 can be formed in the non-display area NA around the intrusive moisture guide layer 124. In other words, the getter 126 can be formed in such a manner as to come into contact with the intrusive moisture guide layer 124.

The intrusive moisture guide layer 124 can be formed from a transparent material and in a plate shape. The intrusive moisture guide layer 124 formed in the plate shape guides intrusive moisture to flow laterally. The getter 126 absorbs the intrusive moisture flowing laterally along the intrusive guide layer 124. In accordance therewith, the moisture intrusion into the light emission diode layer 111 can be prevented.

In this manner, moisture passing through the TFE layer 170 can be dispersed laterally along the intrusive moisture guide layer 124 within the display area AA and absorbed by the getter 126 within the non-display area NA. As such, the moisture intrusion into the light emission diode layer 111 within the display area AA can be prevented. In accordance therewith, a stained image and a pixel defect can be prevented. As a result, picture quality can be enhanced.

Although the intrusive moisture guide layer 124 and the getter 126 are formed between the second organic and inorganic films 174 and 176, but the second embodiment is not limited to this. In other words, the intrusive moisture guide layer 124 and the getter 126 can be formed on any one of the organic and inorganic films.

As described above, the OLED devices of the present embodiments provide the intrusive moisture guide layer and the getter and prevent the moisture intrusion into the light emission diode layer. As such, a stained image and a pixel defect can be prevented. Therefore, the OLED devices can enhance picture quality.

It should be understood that numerous other modifications and embodiments can be devised by those skilled in the art that will fall within the spirit and scope of the principles of this disclosure. In other words, although embodiments have been described with reference to a number of illustrative embodiments thereof, this disclosure is not limited to those. Accordingly, the scope of the present disclosure shall be determined only by the appended claims and their equivalents. In addition, variations and modifications in the component parts and/or arrangements, alternative uses must be regarded as included in the appended claims.

What is claimed is:

1. An organic light emitting display device, comprising:
   a substrate comprising a display area and a non-display area;
   a light emission diode layer disposed on the substrate and configured to emit light;
   a thin film encapsulation (TFE) layer on the light emission diode layer in a stacked layer structure of organic and inorganic films and configured to protect the light emission diode layer from oxygen and moisture;
   a getter on an organic film of said thin film encapsulation (TFE) layer in the non-display area and configured to absorb mositure from the thin film encapsulation (TFE) layer; and
   an intrusive moisture guide layer disposed under the thin film encapsulation (TFE) layer and configured to guide any moisture from the thin film encapsulation (TFE) layer to the getter.

2. The organic light emitting display device of claim 1, wherein the intrusive moisture guide layer and the getter are disposed in the same layer.

3. The organic light emitting display device of claim 1, wherein the getter contacts the intrusive moisture guide layer.

4. The organic light emitting display device of claim 1, wherein the intrusive moisture guide layer is disposed in the display area.

5. The organic light emitting display device of claim 1, wherein the intrusive moisture guide layer and the getter are disposed in a middle portion of the thin film encapsulation (TFE) layer.

6. The organic light emitting display device of claim 1, wherein the light emission diode layer comprises a transparent electrode, a hole transport layer, an light emission layer, an electron transport layer, and a metal electrode.

7. The organic light emitting display device of claim 1, wherein the intrusive moisture guide layer comprises a plate shape and is configured to disperse the moisture laterally.

8. The organic light emitting display device of claim 1, wherein the intrusive moisture guide layer has a refractive index between those of the light emission diode layer and the thin film encapsulation (TFE) layer.

9. The organic light emitting display device of claim 1, wherein the intrusive moisture guide layer and the getter are disposed on the inorganic film.

10. The organic light emitting display device of claim 5, wherein the intrusive moisture guide layer is disposed between the organic film and inorganic film of the thin film encapsulation (TFE) layer.

11. The organic light emitting display device of claim 1, wherein the instrusive moisture guide layer comprises a transparent material.

12. An apparatus, comprising:
    a light emission structure, comprising a stacked layer configuration, on a display area of a substrate; and
    a thin film encapsulation (TFE) structure, comprising a stacked layer configuration comprising organic and inorganic films, covering both the display area and a non-display area of the substrate, and configured to protect the light emission structure from oxygen or moisture, the TFE structure including a guide layer, above the light emission structure extending into a portion of the non-display area of the substrate, the TFE structure configured to further protect the light emission structure from oxygen or moisture.

13. The apparatus of claim 12, further comprising a getter at side edges of the guide layer, the getter extending into the portion of the non-display area of the substrate to absorb moisture from the guide layer.

14. The apparatus of claim 13, wherein the getter is configured to enclose the display area.

15. The apparatus of claim 14, wherein the guide layer comprises a refractive index between a refractive index of the light emission structure and a refractive index of at least some of the organic and inorganic films in the TFE structure, the refractive index minimizing light loss.

16. apparatus of claim 15, wherein the guide layer is disposed in a planar surface in contact with at least one inorganic film of the stacked layer configuration of the TFE structure.

17. The apparatus of claim 16, further comprising adhesive layers that provide adhesion between the organic and inorganic films in the TFE structure, the adhesive layers comprising at least one among cpoxy based resins and acrylatc based resins.

* * * * *